(12) United States Patent
Lih

(10) Patent No.: US 7,626,853 B1
(45) Date of Patent: Dec. 1, 2009

(54) METHOD OF OPERATING MEMORY CELL PROVIDING INTERNAL POWER SWITCHING

(75) Inventor: Yolin Lih, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 163 days.

(21) Appl. No.: 11/932,738

(22) Filed: Oct. 31, 2007

Related U.S. Application Data

(60) Provisional application No. 60/888,011, filed on Feb. 2, 2007.

(51) Int. Cl.
G11C 11/00 (2006.01)
(52) U.S. Cl. .......................... 365/154; 365/156; 365/226
(58) Field of Classification Search .................. 365/154, 365/156, 226
See application file for complete search history.

(56) References Cited

U.S. PATENT DOCUMENTS 7,397,693 B2 * 7/2008 Yamaoka et al. ............ 365/154
7,502,275 B2 * 3/2009 Nii et al. ..................... 365/226

\* cited by examiner

Primary Examiner—Huan Hoang
(74) Attorney, Agent, or Firm—Osha • Liang LLP

(57) ABSTRACT

Various implementations are provided that may be used to improve the writeability of individual memory cells providing internal power switching. For example, in one implementation, a method is provided for operating a memory device including a first static random access memory (SRAM) cell including first and second cross-coupled logic gates. The method includes providing a first power level to the first and second cross-coupled logic gates during a read operation performed on the first SRAM cell, and receiving a logic signal at the first SRAM cell. The method also includes switching within the first SRAM cell from providing the first power level to the cross-coupled logic gates to providing a second power level to the cross-coupled logic gates in response to the logic signal to facilitate writing a first logic state into the first SRAM cell.

18 Claims, 5 Drawing Sheets

METHOD OF OPERATING MEMORY CELL PROVIDING INTERNAL POWER SWITCHING

CROSS-REFERENCE TO RELATED APPLICATIONS

This application claims the benefit of U.S. Provisional Patent Application No. 60/888,011 filed on Feb. 2, 2007 and entitled "Memory Cells with Power Switch for Write Operations", which is incorporated herein by reference.

BACKGROUND

As is well known, arrays of static random access memory (SRAM) cells can be used to maintain logic states corresponding to various associated data values. Individual SRAM cells of such arrays may be implemented, for example, using cross-coupled logic gates. It is generally desirable for SRAM cells to hold their stored logic states despite possible changes in voltage, temperature, or other operating conditions. It is also desirable for SRAM cells to permit changes in their logic states in response to write operations. Unfortunately, existing SRAM cell designs often fail to provide high degrees of both stability and writeability.

Certain SRAM cell designs can suffer stability problems. For example, the logic states of some SRAM cells of an array may be disturbed when write operations are performed on other SRAM cells in the array. This can be particularly troublesome for SRAM cells having bidirectional read/write ports that are enabled by word lines shared by other SRAM cells. The possibility of such disturbances can limit the various ways in which such SRAM cells may be operated.

In this regard, it may be necessary to avoid performing column multiplexing operations or partial-word write operations on such SRAM cells. However, this can limit the area efficiency, speed efficiency, and increase the control logic complexity associated with such SRAM cells. Such bidirectional-ported SRAM cells may alternatively be operated in a read-modify-write manner in which the complete content of a row of SRAM cells is read out, and then the read data and new write data are combined and written back into the row. Such an approach can significantly reduce the operating frequency of SRAM cells (for example, by approximately 50%), requires additional expensive control circuitry, can limit the area efficiency, and complicates data verification.

In order to reduce the possibility of such disturbances, SRAM cells may be implemented with separate unidirectional ports for reading and writing operations. For example, a plurality of write ports may be provided for writing different logic states into SRAM cells in the same row or column. Unfortunately, SRAM cells using multiple write ports may not always be compatible with other approaches that are used to improve the writeability of SRAM cells. Moreover, as SRAM operating voltages are reduced, variations in operating conditions and SRAM components can more easily impact the operation of SRAM cells which can have a correspondingly greater effect on stability and writeability.

SUMMARY

Various implementations are provided that may be used to improve the writeability of individual SRAM cells without compromising the stability of other SRAM cells in an array of SRAM cells of a memory device. For example, in one embodiment, a method of operating a memory device is provided. The memory device includes a first static random access memory (SRAM) cell including first and second cross-coupled logic gates. The method includes providing a first power level to the first and second cross-coupled logic gates during a read operation performed on the first SRAM cell. The method also includes receiving a logic signal at the first SRAM cell. The method further includes switching within the first SRAM cell from providing the first power level to the first and second cross-coupled logic gates to providing a second power level to the first and second cross-coupled logic gates in response to the logic signal to facilitate writing a first logic state into the first SRAM cell during a write operation performed on the first SRAM cell.

Additional embodiments are further set forth herein. These and other features and advantages of the invention will be more readily apparent from the detailed description of the embodiments set forth below taken in conjunction with the accompanying drawings.

DETAILED DESCRIPTION

In accordance with various embodiments further described herein, an SRAM cell may be implemented and operated in a manner to improve its writeability and stability. By selectively providing a power level to one or more cross-coupled logic gates of an SRAM cell, the writeability of SRAM cells can be improved. In particular, the SRAM cell may be implemented with an internal power switch (for example, implemented by one or more power gate transistors in certain embodiments). By switching the internal power switch, power levels (for example, various voltages and/or currents) may be selectively provided to one or more of the cross-coupled logic gates on a cell-by-cell basis. As a result, the writeability of individual SRAM cells may be improved without compromising the stability of other SRAM cells in a shared row or column of an SRAM cell array of a memory device.

Such SRAM cells may be implemented using one or more bidirectional read/write ports, or separate read and write ports. In embodiments where SRAM cells are implemented with unidirectional write ports, different logic states may be simultaneously written to individual SRAM cells of the array without disturbing logic states of other SRAM cells. Also, in embodiments where SRAM cells are implemented with single ended read or write ports, less chip area is consumed.

Figure 1:
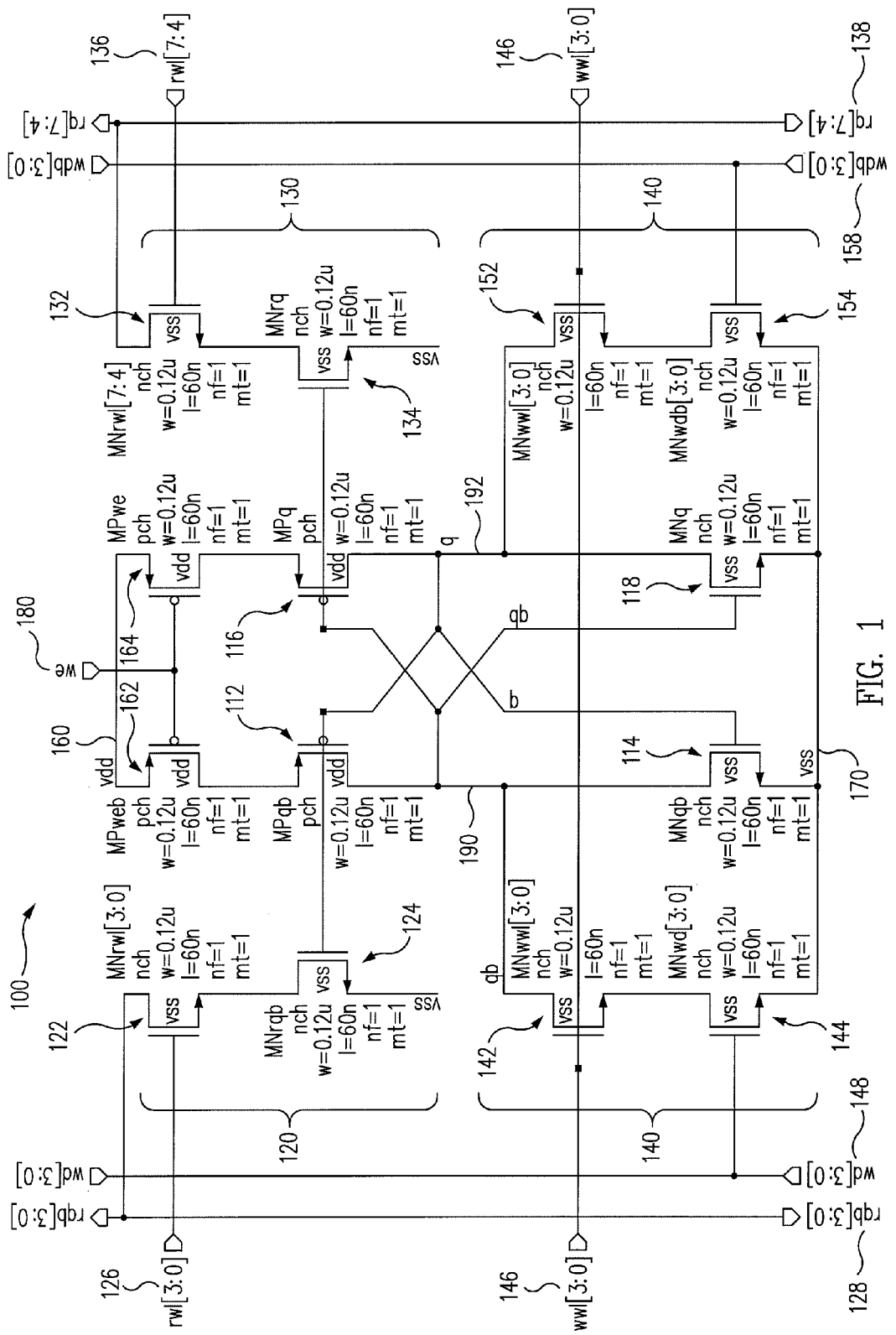
FIG. 1 illustrates a first SRAM cell circuit in accordance with an embodiment of the invention.

Referring now to the drawings wherein the showings are for purposes of illustrating embodiments of the invention only, and not for purposes of limiting the same, FIG. 1 illustrates a first SRAM cell circuit 100 in accordance with an embodiment of the invention. Circuit 100 may be used to implement any desired one of a plurality of SRAM cells arranged in a plurality of rows and/or columns. Accordingly, a plurality of circuits 100 may be used to implement an array of SRAM cells.

As shown in FIG. 1, circuit 100 includes a pair of cross-coupled inverters provided by transistors 112/114 and 116/118, respectively, which may be used to store a first logic state or a second logic state corresponding to voltages maintained at nodes 190 and 192. Transistor 112 is connected with a power gate transistor 162 which is connected with a reference voltage 160 (labeled Vdd) and is responsive to a write enable signal 180 (labeled we). Transistor 116 is connected with a power gate transistor 164 which is connected with reference voltage 160 and is also responsive to write enable signal 180. Each of transistors 114 and 118 are connected with a reference voltage 170 (labeled Vss) which may correspond, for example, to ground in this embodiment.

Circuit 100 also includes a plurality of read ports 120 and 130 which are implemented as single ended read ports in the embodiment of FIG. 1. In particular, four read ports 120 are connected with node 192 of circuit 100, and four additional read ports 130 are connected with node 190. However, any desired number of single ended or differential read ports may be provided in other embodiments.

In the embodiment shown in FIG. 1, read ports 120 are implemented by a plurality of transistors 122 (labeled MNrwl [3:0]), which are connected with transistor 124. In this regard, although transistors 122 are illustrated by a single transistor in FIG. 1, four of transistors 122 (corresponding to MNrwl[0] through MNrwl[3]) are provided in circuit 100. Each of transistors 122 is connected with transistor 124. In another embodiment (not shown), a plurality of transistors 124 may be provided, with each of transistors 124 connected with a corresponding one of transistors 122.

As shown in FIG. 1, the gate of transistor 124 is connected with node 192 of circuit 100. Accordingly, transistor 124 turns on if node 192 is set to a logic high voltage greater than the threshold voltage of transistor 124. Similarly, transistor 124 turns off if node 192 is set to a logic low voltage lower than the threshold voltage of transistor 124.

Each of transistors 122 is connected with a corresponding one of read word lines 126 (labeled rwl[3:0]) and a corresponding one of read data lines 128 (labeled rqb[3:0]) which are used to read logic states stored by circuit 100. For example, if one of read word lines 126 is set to a logic high value, its associated transistor 122 turns on. If node 192 is set to a logic high value, transistor 124 also turns on. In this case, the combined operation of transistors 122 and 124 pull the associated read data line 128 down to a logic low value that is detected as a first logic state by appropriate read circuitry, such as a sense amplifier (not shown) connected with the associated read data line 128. If node 192 is set to a logic low value, transistor 124 turns off. As a result, the associated read data line 128 is not pulled down which is detected as a second logic state.

As shown in FIG. 1, read ports 130 are implemented in a similar fashion as described above with regard to read ports 120. In this regard, read ports 130 are implemented by a plurality of transistors 132 (labeled MNrwl [7:4]) and a transistor 134. Each of transistors 132 is connected with transistor 134 which is connected with node 190 and are switched on and off in response to the voltage of node 190. In addition, each of transistors 132 is connected with a corresponding one of read word lines 136 (labeled rwl[7:4]), and a corresponding one of read data lines 138 (labeled rq[7:4]) which are used to read logic states stored by circuit 100 in a similar fashion to that described above with regard to read ports 120.

Advantageously, the implementation of read ports 120 and 130 described above improves the stability of logic states stored by circuit 100. In this regard, nodes 190 and 192 are not directly connected to read data lines 128 and 138 but are rather insulated by transistors 122/124 and 132/134. Accordingly, nodes 190 and 192 switch transistors 124 and 134 on and off to selectively pull down read data lines 128 and 138 without requiring nodes 190 and 192 to drive current directly to read ports 120 and 130 during read operations.

Circuit 100 also includes a plurality of write ports 140 which are implemented as differential write ports in the embodiment of FIG. 1. In particular, four write ports 140 are connected with nodes 190 and 192 of circuit 100. However, any desired number of single ended or differential write ports may be provided in other embodiments.

In the embodiment shown in FIG. 1, write ports 140 are implemented by a plurality of transistors 142 (labeled MNwwl [3:0]), 144 (labeled MNwd [3:0]), 152 (labeled MNwwl [3:0]), and 154 (labeled MNwdb [3:0]). In this regard, although transistors 142, 144, 152, and 154 are each illustrated by single transistors in FIG. 1, four of each of transistors 142, 144, 152, and 154 are provided in circuit 100.

As shown in FIG. 1, each of transistors 142 and 152 is connected with a corresponding one of transistors 144 and 154, and a corresponding one of nodes 190 and 192, respectively. In addition, the gates of transistors 142 and 152 are connected with a corresponding one of write word lines 146 (labeled wwl[3:0]) used to turn on one or more of transistors 142 and 152 during a write operation. In this regard, each of write word lines 146 is connected with one of transistors 142 and one of transistors 152.

As shown in FIG. 1, the gates of transistors 144 and 154 are connected with a corresponding one of write data lines 148 (labeled wd[3:0]) and 158 (labeled wdb[3:0]), respectively, which are used to provide differential data values corresponding to logic states to be written into circuit 100 during write operations. Accordingly, transistors 142 and 144 pull node 190 down to a logic low voltage if a corresponding one of write word lines 146 and a corresponding one of write data lines 148 are set to logic high values. Similarly, transistors 152 and 154 pull node 192 down to a logic low voltage if a corresponding one of write word lines 146 and a corresponding one of write data lines 158 are each set to logic high values. At other times, when write operations are not being performed, write data lines 148 and 158 may all be set to logic low values.

Advantageously, the implementation of write ports 140 described above can also improve the stability of logic states stored by circuit 100. In this regard, nodes 190 and 192 are not directly connected to write data lines 148 and 158 but are rather insulated by transistors 142/144 and 152/154. In addition, the power of external write circuitry may be reduced because the voltages at nodes 190 and 192 are adjusted in response to signals provided to write ports 140 without requiring nodes 190 and 192 to draw current directly from write data lines 148 and 158 during write operations.

Although circuit 100 includes a plurality of read ports 120/130 and a plurality of write ports 140, circuit 100 may alternatively be implemented with one or more bidirectional read/write ports. For example, in one embodiment, circuit 100 may include a single bidirectional read/write port implemented by an appropriate pass gate. In another embodiment, circuit 100 may include multiple bidirectional read/write ports implemented by multiple pass gates.

While circuit 100 is storing a given logic state, write enable signal 180 may be set to a logic low value (for example, approximately equal to reference voltage 170 which is connected to ground in this embodiment). As a result, both of power gate transistors 162 and 164 turn on to provide reference voltage 160 to transistors 112/114 and 116/118, respectively in order to maintain a stored logic state in circuit 100. For example, if circuit 100 is storing a first logic state (e.g., corresponding to a data value of 0), node 190 may be set to a logic low voltage while node 192 is set to a logic high voltage. Accordingly, transistors 114 and 116 turn on, and transistors 112 and 118 turn off. In this case, because power gate transistor 164 turns on by write enable signal 180, transistor 116 pulls up the voltage of node 192 to maintain the first logic state.

Similarly, if circuit 100 is storing a second logic state (e.g., corresponding to a data value of 1), node 192 may be set to a logic low voltage while node 190 is set to a logic high voltage. Accordingly, transistors 112 and 118 turn on, and transistors 114 and 116 turn off. In this second case, because power gate transistor 162 also turns on by write enable signal 180, transistor 112 pulls up the voltage of node 190 to maintain the second logic state.

During read operations performed on circuit 100, write enable signal 180 may remain set to a logic low value. Power gate transistors 162 and 164 will therefore turn on and continue to provide power to transistors 112/114 and 116/118. Depending on the logic state currently stored by circuit 100 node 190 or 192 is pulled up to a logic high voltage by transistor 112 or 116. As a result, node 190 or 192 turns on transistor 124 or 134 during the read operation to facilitate the reading of the currently stored logic state at one or more of read ports 120 and 130 by appropriate read circuitry in response to signals provided to one or more of read word lines 126 and 136 as previously described above.

During write operations performed on circuit 100, write enable signal 180 may be initially set to a logic high value (for example, approximately equal to reference voltage 160 in this embodiment) and then reset back to a logic low value after a time period. In one embodiment, write enable signal 180 may transition to a logic high value at approximately the same time as one of write word lines 146 also transitions to a logic high value to begin a write operation.

The logic high value of write enable signal 180 may correspond to a voltage greater than the threshold voltage of each of power gate transistors 162 and 164. As a result, write enable signal 180 can be used to turn off power gate transistors 162 and 164 for a time period until write enable signal 180 is reset to a logic low value. In one embodiment, the logic high value of write enable signal 180 may correspond approximately to reference voltage 160, and the logic low value of write enable signal 180 may correspond approximately to reference voltage 170.

While power gate transistors 162 and 164 are off, the source terminals of transistors 112 and 116 are disconnected from reference voltage 160. As a result, transistors 112 and 116 do not pull up nodes 190 and 192, respectively. This can therefore improve the ability of transistors 142/144 or 152/154 to pull down one of nodes 190 or 192, respectively, in accordance with a new logic state to be written into the SRAM cell during the write operation.

Following a time period, write enable signal 180 resets back to a logic low value. As a result, power gate transistors 162 and 164 turn back on to provide reference voltage 160 to transistors 112 and 116 and pull up a second one of nodes 190 or 192, respectively, to a logic high voltage in accordance with the new logic state.

The operation of circuit 100 can be further understood by way of the following example. Prior to the performance of a write operation, circuit 100 may be configured to store a first logic state wherein nodes 190 and 192 are set to logic low and high voltages. Accordingly, while circuit 100 is storing the first logic state, transistors 114 and 116 turn on, and transistors 112 and 118 turn off.

Then, during a write operation to write a second logic state into circuit 100, one of write data lines 148 is driven low, a corresponding one of write data lines 158 is driven high, and a corresponding one of write word lines 146 is driven high by appropriate control circuitry (not shown). As a result, one of transistors 152 and one of transistors 154 associated with the driven data line 158 and write word line 146 turn on and together pull node 192 down from a logic high voltage to a logic low voltage. Because all of transistors 144 remain off (write data lines 148 are driven low), transistors 112 and 162 continue to pull up node 190 to a logic high voltage.

Also during the write operation, write enable signal 180 switches from a logic low value to a logic high value, thereby turning off power gate transistors 162 and 164. Because power gate transistor 164 turns off, transistor 116 does not significantly pull up the voltage of node 192. Accordingly, transistors 152 and 154 easily pull down the voltage of node 192 without experiencing significant drive-fight with transistor 116.

Transistor 112 turns on as the voltage of node 192 is pulled down below the threshold voltage of transistor 112. However, because power gate transistor 162 is off, transistor 112 is unable to pull up the voltage of node 190. As a result, node 190 remains at a logic low voltage while write enable signal 180 is still set to a logic high value.

Following a time period (for example, approximately equal to one gate delay), write enable signal 180 is reset back to a logic low value and power gate transistors 162 and 164 turn back on. Transistor 112 pulls node 190 up to a logic high voltage and transistors 152 and 154 pull node 192 down to a logic low voltage, thus completing the regeneration of the second logic state in the SRAM cell.

The behavior of transistors 112/114 and 116/118, 142/144 and 152/154, and write data lines 148 and 158 identified in the above example may be reversed during a second write operation to switch circuit 100 from the second logic state to the first logic state.

Figure 2:
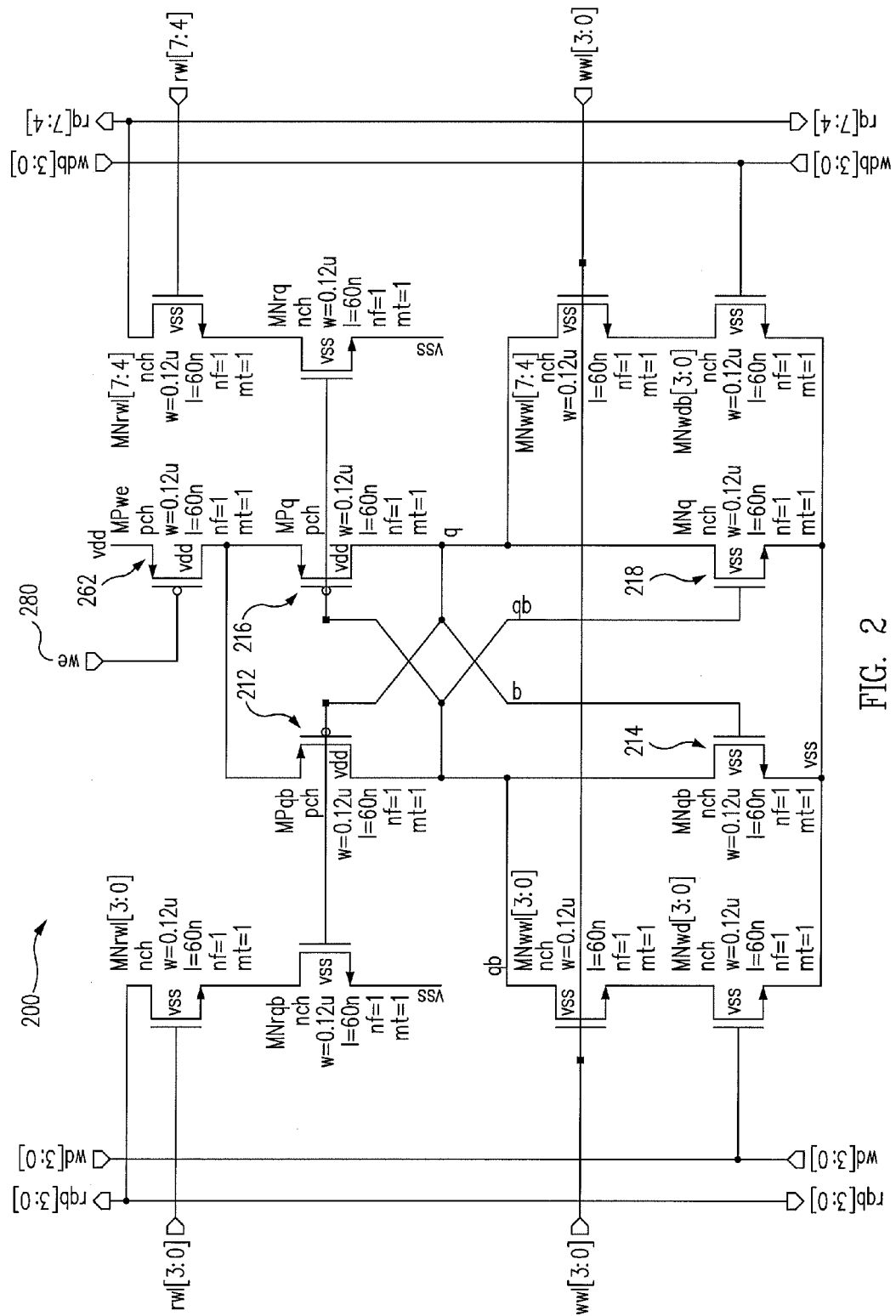
FIG. 2 illustrates a second SRAM cell circuit in accordance with an embodiment of the invention.

FIG. 2 illustrates a second SRAM cell circuit 200 in accordance with an embodiment of the invention. Circuit 200 substantially corresponds to circuit 100 of FIG. 1 and operates in substantially the same manner as described above with regard to circuit 100. However, circuit 200 uses a single power gate transistor 262 in place of the two power gate transistors 162 and 164 of circuit 100. Power gate transistor 262 is responsive to a write enable signal 280 which may be implemented in the manner of transistors 112, 114, 116, and 118 and write enable signal 180 also described above.

Figure 3:
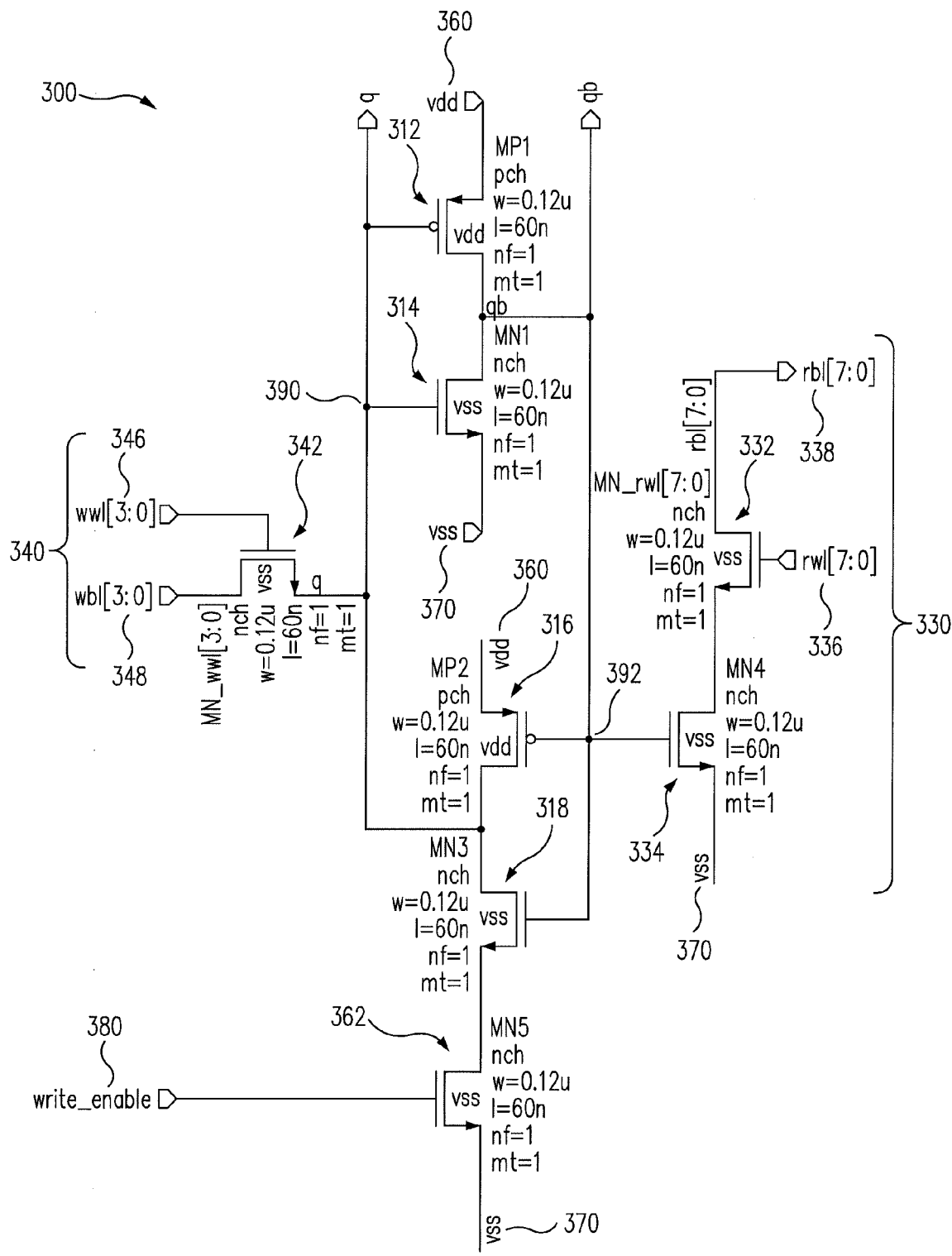
FIG. 3 illustrates a third SRAM cell circuit in accordance with an embodiment of the invention.

FIG. 3 illustrates a third SRAM cell circuit 300 in accordance with an embodiment of the invention. Circuit 300 may be used to implement any desired one of a plurality of SRAM cells arranged in a plurality of rows and/or columns. Accordingly, a plurality of circuits 300 may be used to implement an array of SRAM cells. In contrast to circuits 100 and 200 previously described herein, circuit 300 is implemented with a single ended write port 340 and also includes a single power gate transistor 362 connected with a reference voltage 370 (labeled Vss) which may correspond, for example, to ground in this embodiment. In another embodiment, a plurality of power gate transistors 362 may be provided and switched in the manner of single power gate transistor 362.

As shown in FIG. 3, circuit 300 includes a pair of cross-coupled inverters provided by transistors 312/314 and 316/318, respectively, which may be used to store a first logic state or a second logic state corresponding to voltages maintained at nodes 390 and 392. Transistors 312 and 316 are connected with a reference voltage 360 (labeled Vdd). Transistor 318 is connected with a power gate transistor 362 which is responsive to a write enable signal 380 (labeled write_enable). Power gate transistor 362 is connected with reference voltage 370.

Circuit 300 also includes a plurality of read ports 330 which are implemented as single ended read ports in the embodiment of FIG. 3. In particular, eight read ports 330 are connected with node 392 of circuit 300. However, any desired number of single ended or differential read ports may be provided in other embodiments.

In the embodiment shown in FIG. 3, read ports 330 are implemented by a plurality of transistors 332 (labeled MN_rwl [7:0]), which are connected with transistor 334. In this regard, although transistors 332 are illustrated by a single transistor in FIG. 3, eight of transistors 332 (corresponding to MN_rwl[0] through MN_rwl[7]) are provided in circuit 300. Each of transistors 332 is connected with transistor 334. In another embodiment (not shown), a plurality of transistors 334 may be provided, with each of transistors 334 connected with a corresponding one of transistors 332.

As shown in FIG. 3, the gate of transistor 334 is connected with node 392 of circuit 300. Accordingly, transistor 334 turns on if node 392 is set to a logic high voltage greater than the threshold voltage of transistor 334. Similarly, transistor 334 turns off if node 392 is set to a logic low voltage lower than the threshold voltage of transistor 334.

Each of transistors 332 is connected with a corresponding one of read word lines 336 (labeled rwl[7:0]) and a corresponding one of read data lines 338 (labeled rbl[7:0]) which are used to read logic states stored by circuit 300. For example, if one of read word lines 336 is set to a logic high value, its associated transistor 332 turns on. If node 392 is set to a logic high value, transistor 334 also turns on. In this case, the combined operation of transistors 332 and 334 pull the associated read data line 338 down to a logic low value that is detected as a first logic state by appropriate read circuitry, such as a sense amplifier (not shown) connected with the associated read data line 338. If node 392 is set to a logic low value, transistor 334 turns off. As a result, the associated read data line 338 is not pulled down which is detected as a second logic state. Advantageously, the implementation of read ports 330 described above improves the stability of logic states stored by circuit 300 as previously described with regard to read ports 120 and 130 of FIG. 1.

Circuit 300 also includes a plurality of write ports 340 which are implemented as single ended ports in the embodiment of FIG. 3. In particular, four write ports 340 are connected with node 390 of circuit 300. However, any desired number of single ended or differential write ports may be provided in other embodiments.

In the embodiment shown in FIG. 3, write ports 340 are implemented by a plurality of transistors 342 (labeled MN_wwl[3:0]). In this regard, although transistors 342 are illustrated by a single transistor 342 in FIG. 3, four of transistors 342 are provided in circuit 300.

As shown in FIG. 3, transistors 342 is connected with node 390, a corresponding one of write word lines 346 (labeled wwl[3:0]), and a corresponding one of write data lines 348 (labeled wbl[3:0]) which provides data values corresponding to logic states to be written into circuit 300 during write operations. Accordingly, transistor 342 pulls node 390 down to a logic low voltage if a corresponding one of write word lines 346 and a corresponding one of write data lines 348 are set to logic high values. At other times, when write operations are not being performed, write data lines 348 may all be set to logic low values.

Although circuit 300 includes a plurality of read ports 330 and a plurality of write ports 340, circuit 300 may alternatively be implemented with one or more bidirectional read/write ports. For example, in one embodiment, circuit 300 may include a single bidirectional read/write port implemented by an appropriate pass gate. In another embodiment, circuit 300 may include multiple bidirectional read/write ports implemented by multiple pass gates.

While circuit 300 is storing a given logic state, write enable signal 380 may be set to a logic low value (for example, approximately equal to reference voltage 370 which is connected to ground in this embodiment). Because transistors 312 and 316 remain connected with reference voltage 360, the logic state is maintained by transistors 312/314 and 316/318. For example, if circuit 300 is storing a first logic state (e.g., corresponding to a data value of (0), node 390 may be set to a logic low voltage while node 392 is set to a logic high voltage. Accordingly, transistors 312 and 318 turn on, and transistors 314 and 316 turn off. In this case, transistor 312 pulls up the voltage of node 392 to maintain the first logic state.

Similarly, if circuit 300 is storing a second logic state (e.g., corresponding to a data value of 1), node 392 may be set to a logic low voltage while node 390 is set to a logic high voltage. Accordingly, transistors 314 and 316 turn on, and transistors 312 and 318 turn off. In this second case, transistor 312 pulls up the voltage of node 390 to maintain the second logic state.

During read operations performed on circuit 300, write enable signal 380 may remain set to a logic low value. Power gate transistor 362 will therefore turn off, and the logic state stored by nodes 390 and 392 will be maintained by transistor 312 or 316. As a result, node 392 turns on or turns off transistor 334 during the read operation to facilitate the reading of the currently stored logic state at one or more of read ports 330 by appropriate read circuitry in response to signals provided to one or more of read word lines 336 as previously described above.

During write operations performed on circuit 300, write enable signal 380 may be initially set to a logic high value (for example, approximately equal to reference voltage 360 in this embodiment) and then reset back to a logic low value after a time period. In one embodiment, write enable signal 380 may transition to a logic high value at approximately the same time as one of write word lines 346 also transitions to a logic high value to begin a write operation.

The logic high value of write enable signal 380 may correspond to a voltage greater than the threshold voltage of power gate transistors 362. As a result, write enable signal 380 can be used to turn on power gate transistor 362 for a time period until write enable signal 380 is reset to a logic low value. In one embodiment, the logic high value of write enable signal 380 may correspond approximately to reference voltage 360, and the logic low value of write enable signal 380 may correspond approximately to reference voltage 370.

While power gate transistor 362 is on, it will improve the ability of transistor 314 to pull down node 392 to a logic low voltage in order to counteract the pull up operation of transistor 312. Following a time period, write enable signal 380 resets back to a logic low value. As a result, power gate transistor 362 turns off.

The operation of circuit 300 can be further understood by way of the following example. Prior to the performance of a write operation, circuit 300 may be configured to store a first logic state wherein nodes 390 and 392 are set to logic low and logic high voltages, respectively. Accordingly, while circuit 300 is storing the first logic state, transistors 312 and 318 turn on, and transistors 314 and 316 turn off.

Then, during a write operation to write a second logic state into circuit 300, one of write data lines 348 is driven low and a corresponding one of write word lines 346 is driven high by appropriate control circuitry (not shown). As a result, transistor 342 turns on and pulls up node 390 from a logic low voltage to a logic high voltage, thereby also turning on transistor 314. In addition, write enable signal 380 switches from a logic low value to a logic high value to turn on transistor 362 which operates with transistor 314 to pull down node 392 to a logic low voltage. Accordingly, transistors 314 and 362 easily pull down the voltage of node 392 without experiencing significant drive-fight with transistor 316.

Following a time period (for example, approximately equal to one gate delay), write enable signal 380 is reset back to a logic low value and power gate transistor 362 turns off. In response to the logic low voltage at node 392, transistor 316 turns on and continues to pull node 390 up to a logic high voltage thus completing the regeneration of the second logic state in the SRAM cell.

Figure 4:
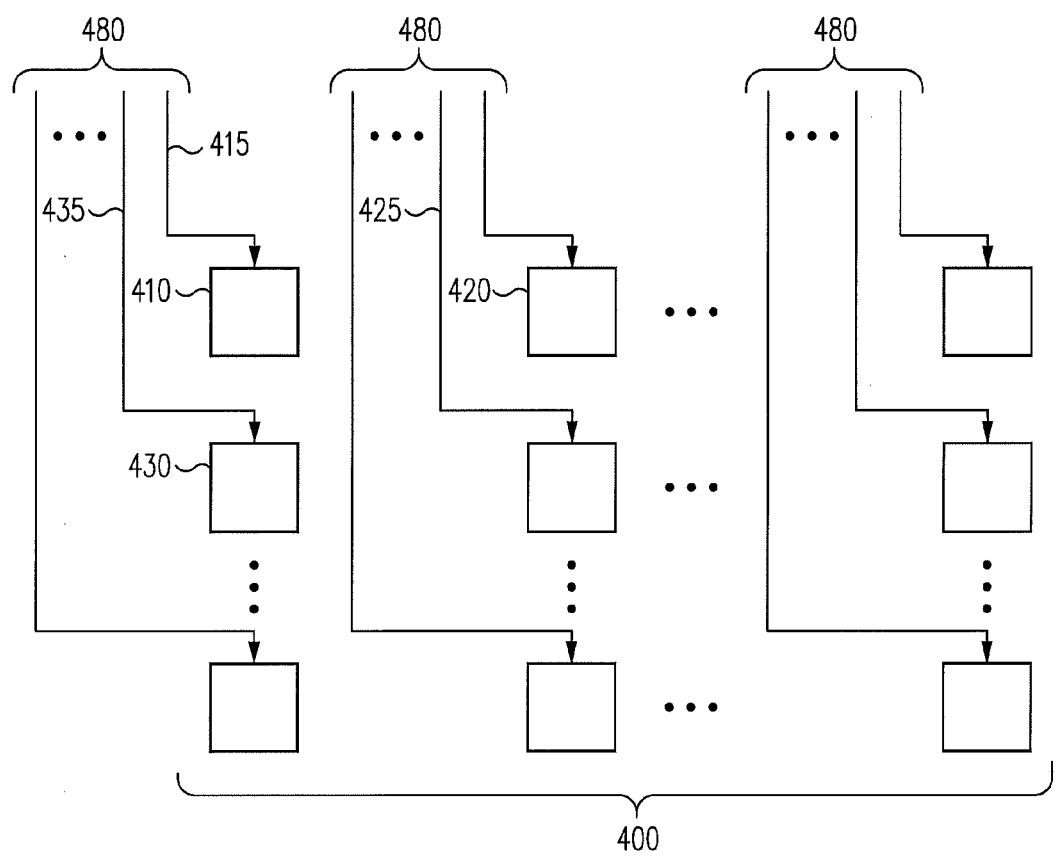
FIG. 4 illustrates a block diagram of an array of SRAM cells of a memory device in accordance with an embodiment of the invention.

FIG. 4 illustrates a block diagram of an array of SRAM cells 400 of a memory device in accordance with an embodiment of the invention. Each of SRAM cells 400 may be implemented, for example, in accordance with circuit 100, circuit 200, or circuit 300 previously described herein. For purposes of clarity, the write ports, read ports, and connected data and word lines of SRAM cells 400 are not shown in FIG. 4. However, such features may be implemented as previously described in relation to FIGS. 1, 2, and 3.

As shown in FIG. 4, SRAM cells 400 receive a plurality of write enable signals 480 which may be implemented, for example, as write enable signals 180 or 280 as previously described with regard to circuit 100 and 200. Write enable signals 480 selectively switch power gate transistors of each SRAM cell 400 on and off independently of other cells in the array. As a result, the writeability of individual SRAM cells 400 is improved without disturbing other SRAM cells of the array.

For example, by switching a write enable signal 415 for SRAM cell 410 to a logic high value, power gate transistors of SRAM cell 410 switch off to facilitate the writing of a new logic state into SRAM cell 410. Meanwhile, write enable signals 425 and 435 associated with SRAM cells 420 and 430, respectively, are maintained at logic low values to maintain the stability of logic states stored by SRAM cells 420 and 430 during the write operation.

In addition, different unidirectional write ports may be used when simultaneously writing different logic states into some or all of the various SRAM cells in columns and/or rows of the array of SRAM cells 400 shown in FIG. 4. Accordingly, the stability of SRAM cells 400 can be maintained during write operations.

Figure 5:
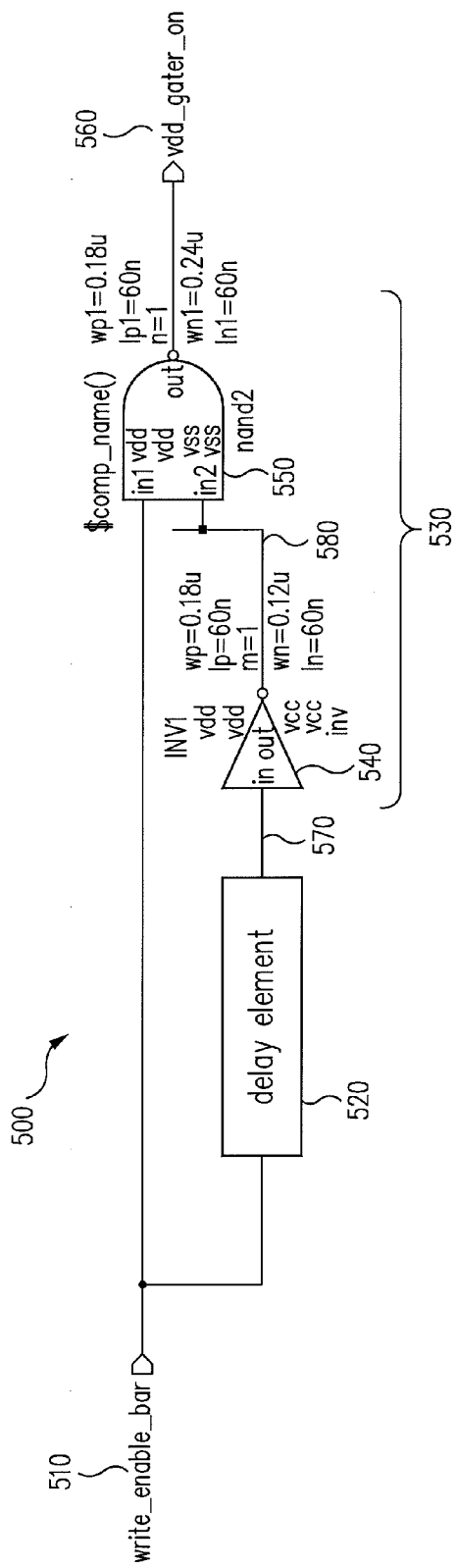
FIG. 5 illustrates a circuit to provide a write enable signal to an SRAM cell in accordance with an embodiment of the invention.

FIG. 5 illustrates a circuit 500 to provide a write enable signal to an SRAM cell in accordance with an embodiment of the invention. Circuit 500 includes a delay element block 520 implemented by appropriate circuitry to delay an input signal to provide a delayed signal. Circuit 500 also includes logic 530 implemented in the illustrated embodiment by an inverter 540 and a NAND gate 550.

Delay element block 520 and NAND gate 550 each receive an input signal 510 (labeled write_enable bar). Delay element block 520 delays input signal 510 to provide a delayed signal 570. Delayed signal 570 is inverted by inverter 540 to provide an inverted delayed signal 580 to NAND gate 550. Accordingly, inverted delayed signal 580 corresponds to a delayed version of input signal 510. NAND gate operates on signals 510 and 580 to provide a write enable signal 560 (labeled vdd_gater_on) that may be used to implement any of write enable signals 180, 280, or 380 described herein.

Embodiments incorporating various features disclosed herein may be implemented in embedded or standalone SRAM memory devices, caches, register files, multi-port memories, translation lookaside buffers (TLBS), content-addressable memories (CAMS), ternary CAMS (TCAMS), or other appropriate devices to operate at lower voltages as compared to traditional six transistor SRAM cells. Such features can be particularly advantageous for mobile, portable, or ultra-low voltage devices in which lower supply voltages may advantageously permit longer battery life and/or use time.

Figure 6:
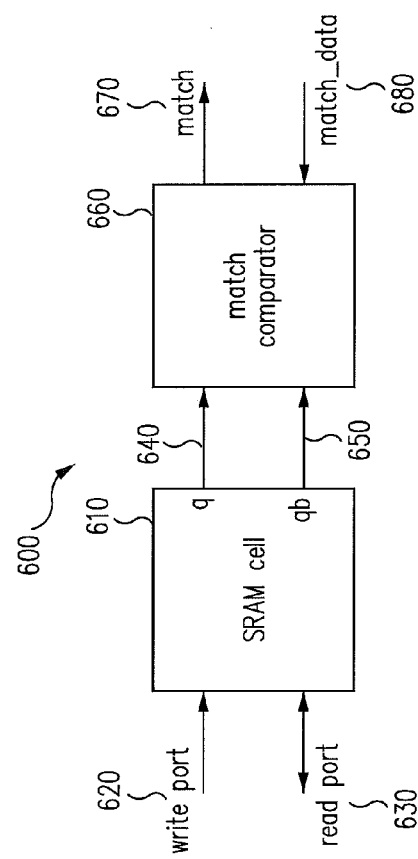
FIG. 6 illustrates an example of a memory device including an SRAM cell in accordance with an embodiment of the invention.

For example, FIG. 6 illustrates an example of a memory device that may be implemented with one or more of the various SRAM cell circuits disclosed herein. In this regard, illustrates a CAM memory device 600 including an SRAM cell 610 and a match comparator 660 in block form. For example, in one embodiment, SRAM cell 610 may be implemented by any of circuits 200, 300, or 400. As shown, SRAM cell 610 includes a read port 620 and a write port 630 implemented by appropriate read and write circuitry of circuits 200, 300, or 400. Logic states stored by SRAM cell 610 are provided to match comparator 660 over complementary data output lines 640 and 650 which may, for example, be connected with read data lines 128 and 158, respectively of circuit 100.

Match comparator 660 is implemented with appropriate circuitry known in the art to compare a data value received at an input port 680 (labeled match data) with logic states received from data output line 640 and/or 650. Match comparator 660 provides an appropriate data signal through output port 670 (labeled match) to indicate the existence of a match or non-match between the data value received at input port 680 and the logic state stored by SRAM cell 610. Other implementations and applications of SRAM cell circuits in accordance with various embodiments described herein are also contemplated.

As known by one of ordinary skill in the art, this invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, register transfer, and/or schematic capture levels. Examples of HDLs include, but are not limited to: GDS II and OASIS (layout level); various SPICE languages, and IBIS (circuit netlist level); Verilog and VHDL (register transfer level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

The foregoing disclosure is not intended to limit the invention to the precise forms or particular fields of use disclosed. It is contemplated that various alternate embodiments and/or modifications to the invention, whether explicitly described or implied herein, are possible in light of the disclosure.

Having thus described embodiments of the invention, persons of ordinary skill in the art will recognize that changes may be made in form and detail without departing from the scope of the invention. Thus the invention is limited only by the claims.

What is claimed is:

1. A method of operating a memory device comprising a first static random access memory (SRAM) cell comprising first and second cross-coupled logic gates, the method comprising:
   providing a first power level to the first and second cross-coupled logic gates during a read operation performed on the first SRAM cell;
   receiving a logic signal at the first SRAM cell; and
   switching within the first SRAM cell from providing the first power level to the first and second cross-coupled logic gates to providing a second power level to the first and second cross-coupled logic gates in response to the logic signal to facilitate writing a first logic state into the first SRAM cell during a write operation performed on the first SRAM cell.

2. The method of claim 1, further comprising switching within the first SRAM cell from providing the second power level to the first and second cross-coupled logic gates to providing the first power level to the first and second cross-coupled logic gates in response to the logic signal to facilitate storing the first logic state written into the first SRAM cell during the write operation.

3. The method of claim 1, wherein the switching comprises switching at least one power gate transistor of the first SRAM cell in response to the logic signal.

4. The method of claim 1, wherein the switching comprises pulling up a voltage of a node of the first SRAM cell used to store the first logic state.

5. The method of claim 1, wherein the switching comprises pulling down a voltage of a node of the first SRAM cell used to store the first logic state.

6. The method of claim 1, wherein the first and second power levels are first and second reference voltages, respectively.

7. The method of claim 1, wherein the memory device further comprises a second SRAM cell, the method further comprising maintaining a second logic state in the second SRAM cell during the write operation.

8. The method of claim 7, wherein the first and second SRAM cells share a row of an array of SRAM memory cells.

9. The method of claim 7, wherein the first and second SRAM cells share a column of an array of SRAM memory cells.

10. A method of operating a memory device comprising a first static random access memory (SRAM) cell comprising first and second cross-coupled logic gates, the method comprising:
    providing a first power level to the first and second cross-coupled logic gates during a read operation performed on the first SRAM cell;
    providing a second power level to the first cross-coupled logic gate during the read operation;
    receiving a logic signal at the first SRAM cell; and
    switching within the first SRAM cell to connect the second cross-coupled logic gate to the second power level in response to the logic signal to facilitate writing a first logic state into the first SRAM cell during a write operation performed on the first SRAM cell.

11. The method of claim 10, further comprising switching within the first SRAM cell to disconnect the second cross-coupled logic gate from the second power level in response to the logic signal to facilitate storing the first logic state written into the first SRAM cell during the write operation.

12. The method of claim 10, wherein the switching comprises switching at least one power gate transistor of the first SRAM cell in response to the logic signal.

13. The method of claim 10, wherein the switching comprises pulling up a voltage of a node of the first SRAM cell used to store the first logic state.

14. The method of claim 10, wherein the switching comprises pulling down a voltage of a node of the first SRAM cell used to store the first logic state.

15. The method of claim 10, wherein the first and second power levels are first and second reference voltages, respectively.

16. The method of claim 10, wherein the memory device further comprises a second SRAM cell, the method further comprising maintaining a second logic state in the second SRAM cell during the write operation.

17. The method of claim 16, wherein the first and second SRAM cells share a row of an array of SRAM memory cells.

18. The method of claim 16, wherein the first and second SRAM cells share a column of an array of SRAM memory cells.

* * * * *